United States Patent
Yamamoto et al.

(10) Patent No.: US 7,154,341 B2
(45) Date of Patent: Dec. 26, 2006

(54) COMMUNICATION SEMICONDUCTOR INTEGRATED CIRCUIT DEVICE AND WIRELESS COMMUNICATION SYSTEM

(75) Inventors: Satoru Yamamoto, Takasaki (JP); Hirotaka Oosawa, Isesaki (JP); Toshiya Uozumi, Takasaki (JP); Noriyuki Kurakami, Maebashi (JP); Jiro Shinbo, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 73 days.

(21) Appl. No.: 10/994,280

(22) Filed: Nov. 23, 2004

(65) Prior Publication Data

US 2005/0116781 A1 Jun. 2, 2005

(30) Foreign Application Priority Data

Dec. 2, 2003 (JP) ............................. 2003-402560

(51) Int. Cl.
*H03L 7/00* (2006.01)
(52) U.S. Cl. .................... 331/2; 331/46; 455/255; 455/259; 455/260; 455/264; 455/265; 455/75; 455/76; 455/78
(58) Field of Classification Search .............. 331/2, 331/46; 455/75, 76, 78, 255, 259, 260, 264, 455/265
See application file for complete search history.

(56) References Cited

U.S. PATENT DOCUMENTS 6,766,178 B1* 7/2004 Damgaard et al. ......... 455/552.1

FOREIGN PATENT DOCUMENTS

JP 2003-152535 5/2003

* cited by examiner

*Primary Examiner*—Arnold Kinkead
(74) *Attorney, Agent, or Firm*—Mattingly, Stanger, Malur & Brundidge, P.C.

(57) ABSTRACT

A communication semiconductor integrated circuit device includes an RFVCO and a TXVCO and is formed over one semiconductor substrate, and has a first operation mode (idle mode) which does not perform transmission and reception, a second operation mode (warmup mode) which performs a preparation prior to the start of transmission or reception, and a third operation mode (transmission or reception mode) which performs transmission or reception. In the first operation mode, two oscillators are deactivated, and the operation of selecting a frequency band to be used in at least the TXVCO which generates a transmit signal, is performed in the second operation mode. In the communication semiconductor integrated circuit device, a high frequency signal generator which generates a signal having a desired frequency with an oscillation signal outputted from a crystal oscillator as a reference signal, a reception system circuit (RXC) including a frequency converter, and a transmission system circuit (TXC) including the TXVCO which generates the transmit signal, are respectively formed in different semiconductor regions isolated by insulators.

14 Claims, 8 Drawing Sheets

COMMUNICATION SEMICONDUCTOR INTEGRATED CIRCUIT DEVICE AND WIRELESS COMMUNICATION SYSTEM

CROSS-REFERENCE TO RELATED APPLICATION

The present application claims priority from Japanese patent application No. 2003-402560 filed on. Dec. 2, 2003, the contents of which is hereby incorporated by reference into this application.

BACKGROUND OF THE INVENTION

The present invention relates to a technique effective if applied to a semiconductor integrated circuit device in which an on-chipped VCO (voltage-controlled oscillator) capable of performing switching of an oscillation frequency and a PLL circuit including the VCO in a loop are built, and to a technique effective for application to a communication semiconductor integrated circuit device suitable for use in a wireless communication system like, for example, a cellular phone, in which a transmission VCO for upconverting the frequency of a transmit signal and a PLL circuit are built.

A communication semiconductor integrated circuit device (hereinafter called "high frequency IC"), which combines a received signal or a transmit signal with a high-frequency local oscillation signal to downconvert or upconvert the frequency and which modulates the transmit signal and demodulates the received signal, has been used in a wireless communication system like a cellular phone.

As the cellular phone, a cellular phone of a dual band system has heretofore been known which is capable of handling signals lying in two frequency bands like GSM (Global System for Mobile Communication) lying in an 880 to 915 MHz band and DCS (Digital Cellular System) lying in a 1710 to 1785 MHz band, for example. There has recently been a demand for a cellular phone of a triple band system capable of treating with signals of PCS (Personal Communication System) lying in, for example, a 1850 to 1915 MHz band in addition to GSM and DCS. It is expected that the cellular phone needs to be adaptable to many systems. A voltage-controlled oscillator (VCO) used in the cellular phone adaptable to such plural systems needs to be wide in oscillation frequency range. When an attempt is now made to adapt one VCO to all frequencies, the sensitivity (hereinafter called "control sensitivity") of an oscillation frequency with respect to a control voltage of the VCO increases, thus causing a problem that it becomes susceptible to externally-incoming noise and variations in power supply voltage.

Thus, the invention has been proposed which makes it possible to use a VCO while being switched to plural (16) frequency bands, thereby enabling a reduction in the control sensitivity of the VCO while a desired oscillation frequency range is being maintained (see patent document 1: Japanese Unexamined Patent Publication No. 2003-152535 (corresponding USP application: U.S filing date: May 14, 2004 (U.S. Ser. No. 10/495,611)). Incidentally, the present prior invention has adopted a system which previously measures actual frequencies in all frequency bands for the VCO prior to the start of its operation and stores the same in a memory and which compares information about the frequencies and the measured values of frequencies in the memory when oscillation frequency information is given, thereby to determine the optimum frequency band to be used.

On the other hand, efforts have recently been made to incorporate as many circuits as possible in one or several semiconductor integrated circuits in a cellular phone for the purpose of reducing the number of parts and achieving reductions in the size and cost of the device.

As one of them, there is known an attempt to incorporate or build a loop filter provided over a loop of PLL in a high frequency IC into a semiconductor chip.

SUMMARY OF THE INVENTION

The loop filter of PLL comprises capacitive and resistive elements. Such a loop filter was often constituted of external elements. This is because if an attempt is made to on-chip the capacitive elements each having a capacitance value necessary to obtain a desired characteristic, the area of each element becomes very large. In order to reduce the capacitance value, the resistance value of the resistive element may be increased. If, however, the resistance value is made large, then thermal noise of the resistive element increases. The PLL is accompanied by a problem that since the voltage of the loop filter is directly applied to a control terminal of the VCO, the thermal noise developed in the resistive element appears on the output of the VCO if the resistive element constituting the loop filter increases in thermal noise and the control sensitivity of the VCO is high.

Thus, the present inventors or the like have discussed that the number of oscillation frequency bands of the VCO further increases and the rate of change in oscillation frequency with respect to a change in control voltage at each individual frequency band is reduced to lower the VCO's control sensitivity, thereby making it hard to cause the influence of thermal noise to appear on the output of the VCO even if the resistive element constituting the loop filter is made large.

As a result, as in the prior invention, the system for previously measuring the actual frequencies at all the frequency bands to determine the corresponding oscillation frequency band to be used in the VCO capable of performing switching of the oscillation frequency band, and storing them in the memory has the possibility that the capacity of the memory that stores the result of measurement therein will increase and an increase in chip size will occur, and the possibility that as the number of frequency bands (number of bands) for the VCO increases, the measurement time becomes long and hence power consumption will increase. Therefore, there is a possibility that when the number of the frequency bands for the VCO is very large, such a used frequency band determining system as proposed in the prior invention will not be appropriate.

Further, in order to enable high-speed data communications, EDGE (Enhanced Data Rates for GMS Evolution) and GPRS (General Packet Service) modes are being put to practical use in a GSM system in recent years. There is a need to raise the VCO early upon the start of transmission or reception in order to adapt to such high-speed data communications. However, the system for measuring each frequency of the VCO at the time of start of transmission or reception to thereby determine the frequency band to be used has the possibility that when the number of bands increases, the time required to determine the corresponding frequency band becomes long so that the raising of the VCO will be delayed.

An object of the present invention is to provide a communication semiconductor integrated circuit device (high frequency IC) capable of completing the raising of a VCO in a short period of time at the time of start of transmission and reception and starting communications, and a wireless communication system like a cellular phone or the like.

Another object of the present invention is to provide a communication semiconductor integrated circuit device (high frequency IC) capable of performing high-accuracy transmission/reception unsusceptible to noise and reducing a chip size, and a wireless communication system such as a cellular phone or the like.

A further object of the present invention is to provide a communication semiconductor integrated circuit device (high frequency IC) capable of building a PLL in a semiconductor chip inclusive of a loop filter without increasing power consumption and a chip size.

A still further object of the present invention is to provide a wireless communication system such as a cellular phone or the like, which is capable of reducing the number of parts and achieving a size reduction and of making long the maximum callable time and the maximum awaiting time.

The above, other objects and novel features of the present invention will become apparent from the description of the present specification and the accompanying drawings.

A summary of a representative one of the inventions disclosed in the present application will be explained in brief as follows:

A communication semiconductor integrated circuit device comprises an oscillator (RFVCO/first oscillator) capable of performing oscillating operations at a plurality of frequency bands and generating a signal combined with a received signal, a frequency converter which combines the received signal and the oscillation signal generated by the oscillator and converts the received signal to a signal low in frequency, and an oscillator (TXVCO/second oscillator) capable of performing oscillating operations at a plurality of frequency bands and generating a transmit signal having a desired frequency. The communication semiconductor integrated circuit device is formed over one semiconductor substrate and includes a first operation mode (idle mode) which does not perform transmission and reception, a second operation mode (warmup mode) which performs a preparation prior to the start of transmission or reception, and a third operation mode (transmission or reception mode) which performs transmission or reception. In the first operation mode, the two oscillators stop operating, and the operation of selecting a used frequency band for at least the oscillator (TXVCO) that generates the transmit signal is performed in the second operation mode. In the communication semiconductor integrated circuit device, a high frequency signal generator which generates a signal having a desired frequency with an oscillation signal outputted from a crystal oscillator as a reference signal, a reception system circuit including the frequency converter, and a transmission system circuit including the oscillator (TXVCO) that generates the transmit signal are formed in different semiconductor regions isolated by insulators respectively.

According to the above means, since the high frequency signal generator, the reception system circuit and the transmission system circuit are formed in the different semiconductor regions separated by the insulators respectively, high-accuracy transmission/reception unsusceptible to noise is enabled. Further, since circuit-to-circuit noise can be reduced even if the interval between the respective circuits is made narrow, a communication semiconductor integrated circuit device (high frequency IC) small in chip size is obtained. Since the operation of each oscillator is stopped in the first operation mode (idle mode), the generated amount of heat is reduced. Therefore, the chip size of the communication semiconductor integrated circuit device (high frequency IC) can be reduced even from this point of view.

Further, the communication semiconductor integrated circuit device is provided with a loop which controls an oscillation frequency of the oscillator (TXVCO) that generates the transmit signal, switching means capable of supplying a potential of a predetermined level to the second oscillator as a control voltage in a state in which the loop is opened, a variable frequency divider which divides the output signal of the second oscillator at a designated division ratio, a fixed frequency divider which divides the oscillation signal generated by the first oscillator at a predetermined division ratio, a phase comparator which compares the phase of a signal outputted from the variable frequency divider with the phase of a signal outputted from the fixed frequency divider to thereby detect a lead or lag in phase, and a band selection circuit which determines a frequency band to be used in the second oscillator according to the output of the phase comparator. The band selection circuit repeatedly executes the comparison between the phase of the output signal of the variable frequency divider and the phase of the output signal of the fixed frequency divider and a change in select frequency, based on the result of comparison, in a state in which the potential of the predetermined level has been supplied to the second oscillator by the switching means, thereby to select the final selected frequency band by a dichotomizing search system.

According to the above means, a loop filter can easily be built in a semiconductor chip. There was a fear that although the resistance value of a resistive element constituting the loop filter may be increased to reduce the capacitance value of each capacitive element of the loop filter which had heretofore used external elements because the capacitance value was large, and to on-chip the capacitive elements, without varying the characteristic of the filter, thermal noise of the resistive element would increase when the resistance value was increased. Thus, according to the above means, since the control sensitivity of the VCO can be reduced, it is possible to suppress the appearance of noise on the output of the VCO even if the thermal noise exists more or less. Therefore, the resistance value of the resistive element that constitutes the loop filter can be increased and the capacitance value of the capacitive element can be reduced correspondingly, thus enabling on-chipping thereof.

Advantageous effects obtained by a representative one of the inventions disclosed in the present application will be explained in brief as follows:

According to the present invention, high-accuracy transmission/reception unsusceptible to noise is enabled, and a communication semiconductor integrated circuit device (high frequency IC) small in chip size is obtained.

A wireless communication system such as a cellular phone or the like can be realized which is capable of reducing the number of parts, achieving a size reduction and making long the maximum callable time and the maximum awaiting time owing to less power consumption.

With a multi-band configuration of the TXVCO, an oscillating operation can be performed with a high degree of accuracy over a wide frequency range. Further, the control sensitivity of the TXVCO can be lowered with multi-banding. Therefore, a PLL loop is less subject to noise and even to thermal noise developed by a resistive element even if the resistance value increases and the capacitance value decreases, thereby making it easy to build a PLL in a semiconductor chip inclusive of a loop filter.

Since the optimum frequency band is found out or detected while frequency bands for the VCO are being switched by a dichotomizing search system, there is no need to previously measure oscillation frequencies lying in all frequency bands and store them in a memory. Therefore, the time required to determine a frequency band to be used is not taken long. As a result, an increase in circuit's power consumption and an increase in chip size do not occur.

DETAILED DESCRIPTION OF THE PREFFERED EMBODIMENTS

Preferred embodiments of the present invention will next be described with reference to the accompanying drawings.

Figure 1:
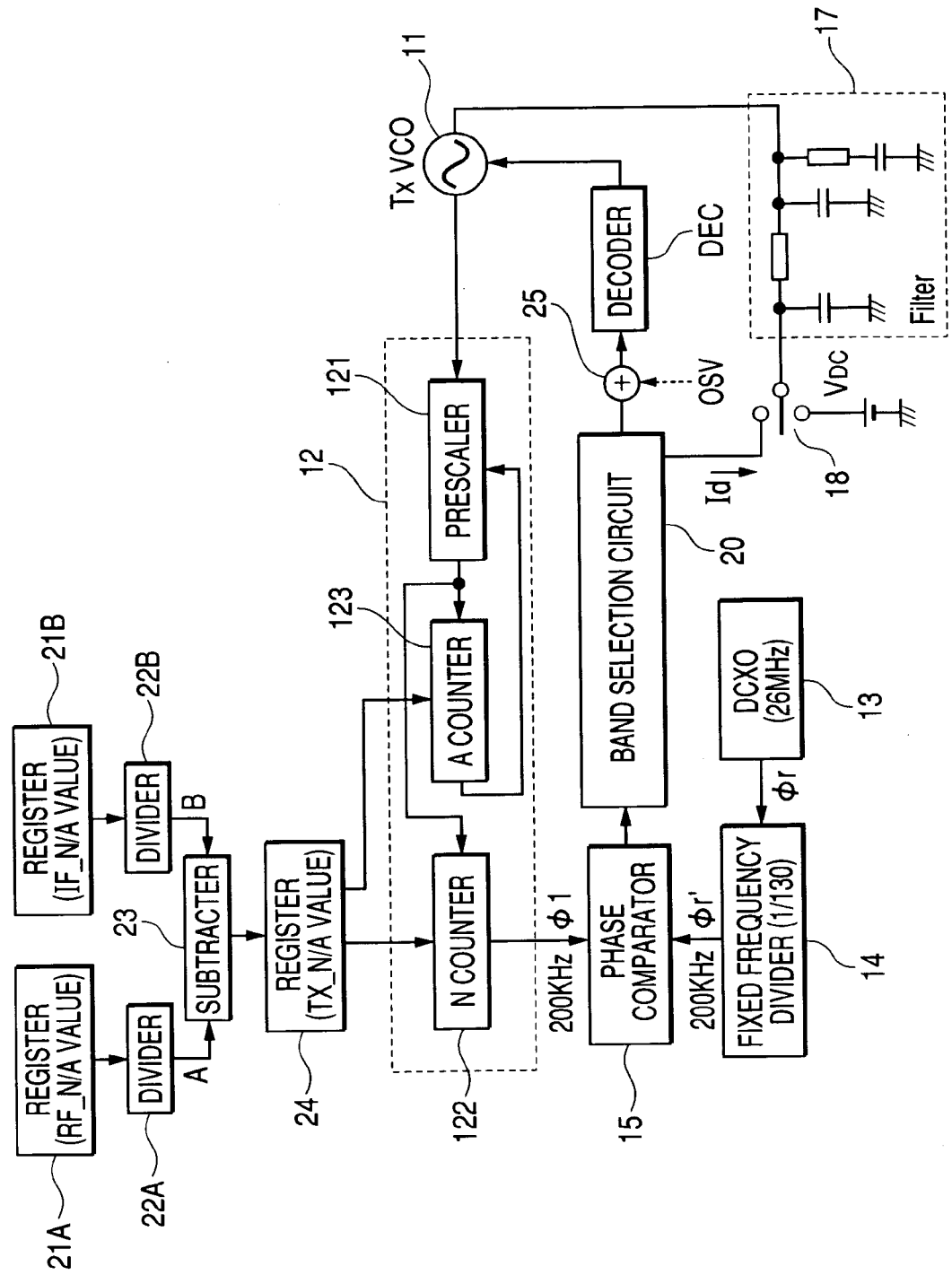
FIG. 1 is a block diagram showing one embodiment of a PLL circuit employed in a transmitting circuit of a communication semiconductor integrated circuit device (high frequency IC) according to the present invention.

One embodiment of a PLL circuit provided with the function of automatically selecting a used band of a transmission VCO (TXVCO) on the basis of set frequency information given from outside is shown in FIG. 1.

The PLL circuit according to the present embodiment comprises a voltage-controlled oscillator (TXVCO) 11, a variable frequency divider 12 which divides an oscillation signal φ0 supplied from the VCO 11 into 1/N, a reference oscillator (DCXO) 13 which generates a reference oscillation signal φr like 26 MHz, a fixed frequency divider 14 which frequency-divides the reference oscillation signal φr generated by the reference oscillator (DCXO) 13, a phase comparator 15 which detects the difference in phase between signals φ1 and φr' divided by the variable frequency divider 12 and the fixed frequency divider 14, a band selection circuit 20 which determines a band to be used in the TXVCO 11 in accordance with the detected phase difference and which generates a current Id corresponding to the detected phase difference and outputs the same therefrom, a decoder DEC which decodes a band select signal outputted from the band selection circuit 20 and supplies a band switch control signal to the TXVCO 11, and a loop filter 17 which generates a voltage corresponding to the detected phase difference outputted from the band selection circuit 20. The PLL circuit is configured in such a manner that the voltage smoothed by the loop filter 17 is fed back to the TXVCO 11 as an oscillation control voltage Vt.

In order to obtain oscillation frequency information of the TXVCO 11, the present embodiment is provided with registers 21A and 21B which respectively hold oscillation frequency set information of an unillustrated RFVCO and oscillation frequency set information of an unillustrated IFVCO both of which are supplied from outside, dividers 22A and 22B for obtaining frequencies at the time that oscillation frequencies designated by these set information are divided by a predetermined ratio, a subtracter 23 which makes the difference between the frequencies calculated from the dividers 22A and 22B and uses it as the oscillation frequency information of the TXVCO 11, and a register 24 which holds the oscillation frequency information calculated by the subtracter 23. Such a configuration is provided because the PLL circuit according to the present embodiment is supposed to be applied to a so-called offset PLL type transmitting circuit shown in FIG. 6. The present embodiment may be configured in such a manner that the registers 21A and 21B, the dividers 22A and 22B and the subtracter 23 are omitted and the oscillation frequency information of the TXVCO 11 is externally set directly to the register 24.

In the present embodiment, although not restricted in particular, the TXVCO 11 is configured so as to have 256 frequency bands (hereinafter called "bands"). The fixed frequency divider 14 has a division ratio of 1/130 and is configured so as to divide a reference oscillation signal φr of 26 MHz and generate a signal of 200 kHz. The loop filter 17 comprises, as a tertiary filter, capacitors C0 and C1, a resistor R1 provided between the capacitors C0 and C1, and a resistor R2 and a capacitor C2 provided in parallel with the capacitor C1. As the resistors R1 and R2 and the capacitors C0, C1 and C2, elements formed in a semiconductor chip are used.

In the PLL circuit according to the present embodiment as well, a selector switch 18, which is capable of supplying a fixed voltage VDC corresponding to substantially the midpoint of a variable range of a control voltage Vt in place of the supply of the current Id outputted from the band selection circuit 20, is provided between the band selection circuit 20 and the loop filter 17. Incidentally, the current Id corresponding to the detected phase difference outputted from the band selection circuit 20 is supplied to the loop filter 17 as a charge current or a discharge current (pull-out current) according to the positive and negative of the phase difference. Although the current Id corresponding to the detected phase difference is outputted from the band selection circuit 20 in the present embodiment, the current Id corresponding to the detected phase difference may be supplied from the phase comparator 15 to the loop filter 17.

Further, an adder 25 for adding a predetermined offset value OSV may be provided between the band selection circuit 20 and the decoder DEC so as to compensate for a decision error caused by a shift in reset operation between the variable frequency divider 12 and the fixed frequency divider 14. One cause of occurrence of the shift in reset operation between the variable frequency divider 12 and the fixed frequency divider 14 results in a delay time difference that arises from the fact that the variable frequency circuit 12 and the fixed frequency divider 14 are different in terms of the length of a path for supply of a reset signal. The reset signal may be supplied from the band selection circuit 20. Alternatively, the reference oscillation signal φr generated by the reference oscillator (DCXO) 13 or a signal obtained by suitably dividing or delaying it can be used. The offset value is supplied from the baseband circuit to the high frequency IC 200 and retained in a predetermined register.

The variable frequency divider 12 is configured using a circuit called "modulo counter". That is, the variable frequency counter 12 comprises a prescaler 121 which inputs an oscillation signal φ0 of the VCO 11 and is capable of dividing it into 1/P or 1/(P+1), and an N counter 122 and an A counter 123 that constitute the modulo counter. The way of dividing the oscillation signal by the prescaler 121 and the modulo counter comprising the N counter 122 and the A counter 123 is an already known technique.

The prescaler 121 is configured so as to be capable of performing two types of divisions different in division ratio, like, for example, a 1/64 division and a 1/65 division. Switching from one division ratio to the other division ratio is performed based on a count end signal of the A counter 123. The N counter 122 and the A counter 123 are programmable counters. An integral part obtained by dividing a desired frequency (oscillation frequency f0 of TXVCO desirous of acquiring it as the output) by the frequency fr' of the division signal φr' of the reference oscillation signal φr and a first division ratio (e.g., P=65) of the prescaler 121 is set to the N counter 122, and its remainder (MOD) is set to the A counter 123. When the respective counters count their set values, they finish counting and count the set values again.

When the prescaler 121 and the modulo counter are operated according to this procedure, the prescaler 121 firstly divides the oscillation signal of the TXVCO 11 into 1/64. When the A counter 123 counts the output of the prescaler 121 to the set value, a count end signal MC is outputted from the A counter 123 so that the operation of the prescaler 121 is switched by the signal MC. The prescaler 121 divides the oscillation signal of the VCO 11 into 1/65 until the A counter 123 counts the set value. Owing to execution of such an operation, the modulo counter is capable of dividing the oscillation signal at a ratio having a decimal fraction without using an integral ratio. The oscillation frequency information (N, A) set to the register 24 are set to the N counter 122 and the A counter 123 respectively.

The phase comparator 15 compares the output φ1 of the variable frequency divider 12 (N counter 122) with the output φr' of the fixed frequency divider 14 and determines whether the phase of the output φ1 of the variable frequency circuit 12 leads the phase of the output φr' of the fixed frequency divider 14. The phase comparator 15 supplies a signal corresponding to the result of determination to the band selection circuit 20.

Figure 2:
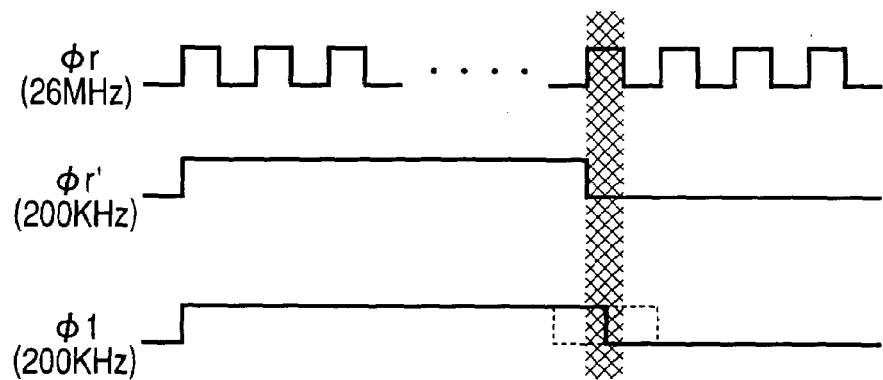
FIG. 2 is a timing chart showing timings for phase comparison at band selection in the PLL circuit shown in FIG. 1.

Described specifically, the phase comparator 15 monitors the output φ1 of the variable frequency divider 12 (N counter 122) by one cycle or period of the reference oscillation signal φr on the falling edge of signal φr' as shown in FIG. 2 on the basis of the signal φr' of 200 kHz outputted from the fixed frequency divider 14 that divides the reference oscillation signal φr. During that period, the phase comparator 15 determines whether φ1 has fallen or φ1 is low or high in level. Incidentally, the variable frequency divider 12 and the fixed frequency circuit 14 are reset for each cycle of the signal φr', and the phase comparator 15 performs its determination.

Since the frequency coincidence is made when φ1 falls in the fall cycle of the signal φr', the phase comparator 15 supplies a signal for instructing the band selection circuit 20 to maintain the present band. If φ1 is low in level when the signal φr' falls, then φ1 has already fallen, i.e., the frequency of φ1 is high. Therefore, the phase comparator 15 supplies a signal for instructing the band selection circuit 20 to select a band lower in frequency than the present band. On the other hand, if φ1 is high in level when the signal φr' falls, then φ1 has not yet fallen, i.e., the frequency of φ1 is low. Therefore, the phase comparator 15 supplies a signal for instructing the band selection circuit 20 to select a band higher in frequency than the present band.

Figure 3:
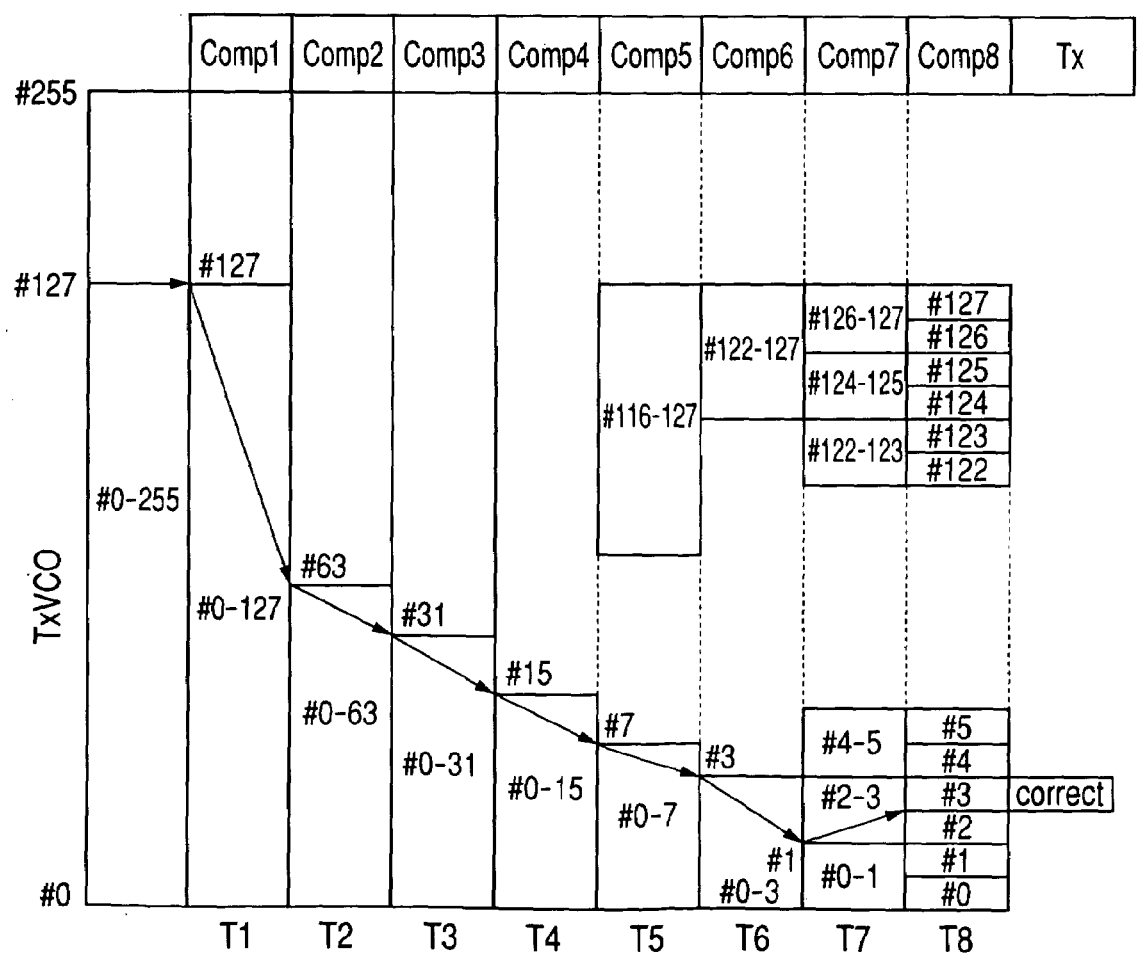
FIG. 3 is a conceptual diagram illustrating a procedure for band selection in the PLL circuit shown in FIG. 1.

The band selection circuit 20 that has accepted the instruction signal outputted from the phase comparator 15 repeats the phase comparison/determination eight times by means of a dichotomizing search system as shown in FIG. 3 to decide a selected band and generate and output band select signals VB0 through VB7. Incidentally, the above band selection/control is carried out in a state in which the selector switch 18 is switched to the fixed voltage VDC side and the fixed voltage VDC is supplied to the TXVCO 11 as the control voltage Vt. When the selected band is determined, the selector switch 18 is switched to the control circuit 20 side so that the voltage of the loop filter 17, which has been decided based on the current supplied from the control circuit 20, is supplied to the TXVCO 11 to carry out PLL frequency-locking.

The first designated band in a select band determining process by the dichotomizing search system corresponds to the central band #127 of 256 bands #0 through #255. Next, the band designated by band switch control signals VB0 through VB7 generated based on the first result of determination corresponds to the center #63 between #127 and #0 when the clock φ1 on the variable frequency divider 12 side leads, and corresponds to the center #191 between #127 and #255 when the clock φ1 lags. The band designated by band switch control signals VB0 through VB7 generated based on the second result of determination corresponds to either the center #31 between #63 and #0, the center #95 between #127 and #63, the center #159 between #127 and #191, or the center #223 between #191 and #255. The band designated by band switch control signals VB0 through VB7 generated based on the third result of determination corresponds to any of #15, #47, #79, #111, #143, #175, #207 and #239. By repeating such operations eight times, the band suitable for the designated oscillation frequency (frequency corresponding to each of set values N and A) is selected from the 256 bands.

Further, the selection band of the VCO 11 is switched under the band selection/control of the present embodiment after the eighth determination without resetting the variable frequency divider 12 and the fixed frequency divider 14. Then, the selector switch 18 is switched from the fixed voltage VDC side to the output terminal side of the band selection circuit 20 to close a PLL loop, thereby shifting the VCO 11 to a state of allowing the VCO 11 to be placed under feedback control.

In the general PLL control method, the variable frequency divider 12 and the fixed frequency divider 14 are reset when the band to be sued is decided and the band switch control signals VB0 through VB7 are supplied to the VCO 11 to set the band. However, such a system that there is a difference between reset timing of the variable frequency divider 12 and reset timing of the fixed frequency divider 14, has the fear that when the variable frequency divider 12 and the fixed frequency divider 14 are reset when the band of the VCO is set, the reset of the variable frequency divider 12 is delayed so that a charge-up signal is outputted from the phase comparator 15 and hence the control voltage Vt of the VCO is significantly shifted, thereby making long the time required to perform PLL frequency-locking. On the other hand, in the present embodiment, the selector switch 18 is switched without resetting the variable frequency divider 12 and the fixed frequency divider 14 after the eighth determination. Therefore, the switch is changed over while the state of the loop during the band selecting operation is being maintained as it is. As a result, the present embodiment has the advantage that the time required to perform the PLL frequency-locking becomes short.

Figure 4:
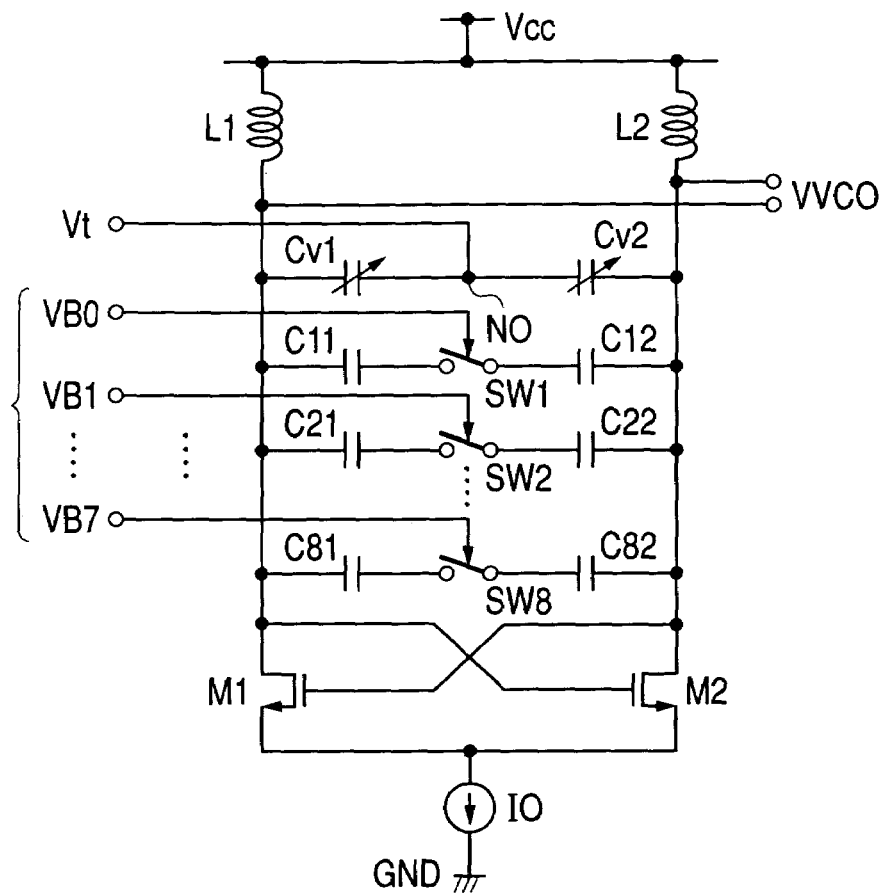
FIG. 4 is a circuit diagram showing one embodiment of a VCO (voltage-controlled oscillator) that constitutes the PLL circuit employed in the embodiment shown in FIG. 1.

A configurational example of the voltage-controlled oscillator (TXVCO) 11 used in the present embodiment is shown in FIG. 4.

The VCO according to the present embodiment is of an LC resonant oscillator and comprises a pair of N channel MOS transistors M1 and M2 of which the sources are connected in common and the gates and drains are cross-connected to one another, a constant current source IO connected between the common sources of the transistors M1 and M2 and a ground point GND, inductors L1 and L2 respectively connected between the drains of the transistors M1 and M2 and a power supply voltage terminal Vcc, variable capacitive elements Cv1 and Cv2 comprising varactor diodes, which are connected in series between the drain terminals of the transistors M1 and M2, a group of a capacitor C11, a switch SW1 and a capacitor C12 connected in series between the drain terminals of the transistors M1 and M2, and a group of C21, SW2 and C22, C31, SW3 and C32, . . . C81, SW8 and C82 connected in parallel to these C1, SW1 and C12.

The VCO employed in the present embodiment is configured in such a manner that the control voltage Vt outputted from the loop filter 17 of FIG. 1 is applied to a connecting node NO of the variable capacitive elements Cv1 and Cv2 so that the oscillation frequency changes continuously, whereas the band switch control signals VB0 through VB7 outputted from the decoder DEC for decoding the output of the band selection circuit 20 are supplied to their corresponding switches SW1 through SW8, where they are set to either the high or low level, whereby the oscillation frequency is changed stepwise (to 256 stages).

The capacitors C11 and C12 are identical in capacitance value to each other. The capacitors C21 and C22, C31 and C32, C41 and C42, C51 and C52, C61 and C62, C71 and C72, and C81 and C82 are also respectively identical in capacitance value to one another. However, the capacitance values of the capacitors C11, C21, C31, C41, C51, C61, C71 and C81 are respectively set so as to have a weight of $2^m$ (where m=0, 1, 2, 3, . . . 7). The total capacitance value C is changed to 256 stages depending on the combinations of the band switch control signals VB0 through VB7. The VCO 11 is operated based on any of the frequency characteristics of 256 bands #0 through #255 shown in FIG. 5.

Figure 5:
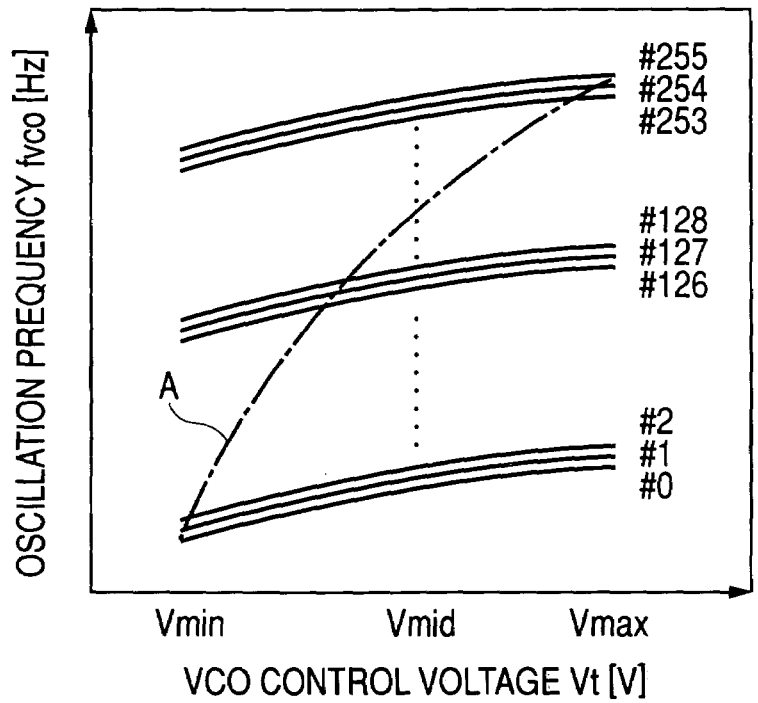
FIG. 5 is a characteristic diagram illustrating the relationship between a control voltage Vt and an oscillation frequency fvco employed in the VCO shown in FIG. 4.

When one attempts to enlarge the frequency range by simply changing the capacitance values of the varactor diodes, based on the control voltage Vt where it is desired to make wide a frequency range to be covered by the VCO, a Vt-fvco characteristic is made steep as indicated by a dashed line A in FIG. 5, and the sensitivity of the VCO, i.e., the ratio (Δf/ΔVt) between the amount of a change in frequency and the amount of a change in control voltage increases, so that the VCO is susceptible to noise. That is, the mere carrying of slight noise on the control voltage Vt will cause a great change in the oscillation frequency of the VCO.

In order to solve such a problem, the VCO employed in the present embodiment is configured in such a manner that the plurality of capacitive elements constituting the LC resonant circuit are provided in parallel, and the capacitive elements connected by the band switch control signals VB0 through VB7 are switched to the 256 stages to change the values of C, thereby making it possible to carry out oscillation control in accordance with the 256 Vt—fvco characteristic lines as indicated by solid lines in FIG. 5. Further, the VCO is operated so as to select any of the characteristics in accordance with the band to be used.

Incidentally, the capacitors C11 through C82 are configured of capacitances each having a sandwich structure of a metal film, an insulating film and a metal film formed over a semiconductor substrate in the LC resonant oscillator according to the present embodiment. A desired capacitance ratio ($2^m$) can be obtained by suitably setting the ratio between the areas of electrodes that constitute the capacitors C11 through C82. The capacitors C11 through C82 are hereinafter called "band switching capacitors". The capacitance between the gate electrode of each MOS transistor and the substrate may be used as each of the capacitors C11 through C82. Although the inductors L1 and L2 can be formed as on-chipped elements each constituted of an aluminum layer formed over the semiconductor substrate, external elements may be used.

One example illustrative of a multi-band type communication semiconductor integrated circuit device (high frequency IC) to which the PLL circuit (see FIG. 1) according to the above embodiment is applied, and a communication system using the multi-band type communication semiconductor integrated circuit device will next be explained using FIG. 6. Incidentally, circuits identical to those shown in FIG. 1 are given like reference numerals through FIG. 6. Dual explanations of the same circuits are avoided.

Figure 6:
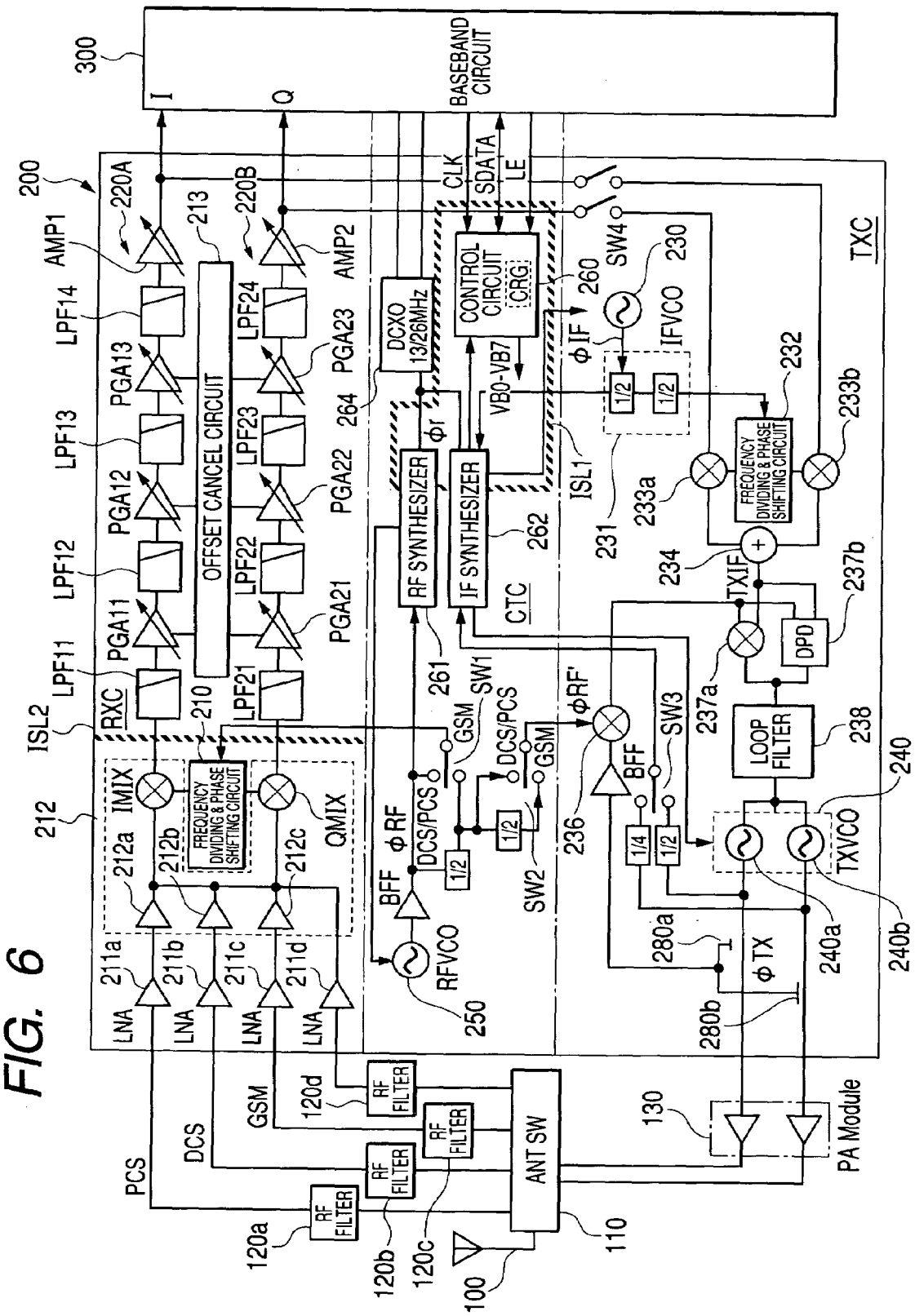
FIG. 6 is a block diagram showing a configurational example illustrative of a high frequency IC according to the present invention and a wireless communication system using the high frequency IC.

As shown in FIG. 6, the system comprises an antenna 100 for transmitting and receiving a signal wave, a transmit-receive changeover switch 110, high frequency filters 120a through 120d each comprising an SAW filter or the like for removing an unnecessary wave from a received signal, a high frequency power amplifier circuit (power module) 130 which amplifies a transmit signal, a high frequency IC 200 which demodulates the received signal and modulates the transmit signal, a baseband circuit 300 which converts transmit data into I and Q signals and controls the high frequency IC 200, etc. The high frequency IC 200 and the baseband circuit 300 are respectively configured over discrete semiconductor chips as a semiconductor integrated circuit device.

Although not restricted in particular, the high frequency IC 200 according to the present embodiment is configured so as to be capable of modulating and demodulating signals lying in four frequency bands, based on the three communication systems of GSM850 and GSM900, DCS1800, and PCS1900. Correspondingly, the high frequency filter is provided with the filter 120a for allowing a received signal lying in the frequency band of PCS1900 to pass therethrough, the filter 120b for allowing a received signal lying in the frequency band of DCS1800 to pass therethrough, and the filters 120c and 120d for allowing a received signal lying in the frequency band of the GSM system to pass therethrough.

The high frequency IC 200 according to the present embodiment comprises, if roughly divided, a reception system circuit RXC, a transmission system circuit TXC, and a control system circuit CTC comprising circuits common to the transmission/reception system circuit, such as a control circuit, a clock generator, etc. other than those.

The reception system circuit RXC comprises low noise amplifiers 211a, 211b, 211c and 211d which respectively amplify received signals lying in the respective frequency bands of PCS, DCS and GSM, a frequency dividing and phase shifting circuit 210 which divides a local oscillation signal φRF generated by a high frequency oscillator (RFVCO) 250 and thereby generates quadrature signals phase-shifted 90° from each other, a mixer 212 which mixes the quadrature signals generated by the frequency dividing and phase shifting circuit 210 into the received signals amplified by the low noise amplifiers 211a, 211b, 211c and 211d to thereby carry out demodulation and down-conversion, high gain amplifier sections 220A and 220B which respectively amplify the demodulated I and Q signals and output them to the baseband circuit 300, an offset cancel circuit 213 for canceling out input DC offsets of amplifiers lying within the high gain amplifier sections 220A and 220B, etc.

The high gain amplifier section 220A has a configuration wherein a plurality of low pass filters LPF11, LPF12, LPF13 and LPF14 and programmable gain amplifiers PGA11, PGA12 and PGA13 are alternately connected in a series configuration with one another and an amplifier AMP1 whose gain is fixed is connected to the final stage. The high gain amplifier section 220A amplifies the demodulated I signal and outputs it to the baseband circuit 300. Similarly, the high gain amplifier section 220B also has a configuration in which a plurality of low pass filters LPF21, LPF22, LPF23 and LPF24 and programmable gain amplifiers PGA21, PGA22 and PGA23 are alternately connected in a series configuration with one another and an amplifier AMP2 whose gain is fixed is connected to the final stage. The high gain amplifier section 220B amplifies the demodulated Q signal and outputs it to the baseband circuit 300.

The offset cancel circuit 213 comprises A/D converters (ADC) which are provided in association with the programmable gain amplifiers PGA11 through PGA23 and convert the differences among their output potentials to their corresponding digital signals in states in which their input terminals are short-circuited, D/A converters (DAC) which generate such input offset voltages as to bring DC offsets of the outputs of their corresponding programmable gain amplifiers PGA11 through PGA23 to "0", based on the results of conversion by these A/D converters and supply the same to their corresponding difference inputs, a control circuit which controls these A/D converters (ADC) and D/A converters (DAC) to allow them to carry out offset cancel operations thereof, etc.

The transmission system circuit TXC comprises an oscillator (IFVCO) 230 which generates an oscillation signal φIF having an intermediate frequency like, for example, 640 MHz, a frequency divider 231 which divides the oscillation signal φIF generated by the oscillator 230 into ¼ and thereby generates a signal like 160 MHz, a frequency dividing and phase shifting circuit 232 which further divides the signal divided by the frequency divider 231 and generates quadrature signals phase-shifted 90° from each other, modulators 233a and 233b which modulate the generated-quadrature signals on the basis of the I signal and Q signal supplied from the baseband circuit 300, an adder 234 which combines the modulated signals, a transmission oscillator (TXVCO) 240 which generates a transmit signal φTX having a predetermined frequency, an offset mixer 236 which mixes a feedback signal obtained by extracting the transmit signal φTX outputted from the transmission oscillator (TXVCO) 240 by means of couplers 280a and 280b or the like and a signal φRF' obtained by dividing the high frequency oscillation signal φRF generated by the high frequency oscillator (RFVCO) 250 used as a local oscillator for generating an oscillation signal for frequency conversion to thereby generate a signal having a frequency equivalent to the difference in frequency therebetween, an analog phase comparator 237a and a digital phase comparator 237b each of which compares the output of the offset mixer 236 with the signal TXIF combined by the adder 234 to thereby detect a difference in phase, a loop filter 238 which generates a voltage corresponding to the output of each of the phase detectors 237a and 237b, etc.

Incidentally, the resistors and capacitors that constitute the loop filter 238 make use of on-chipped elements. The transmission oscillator (TXVCO) 240 comprises an oscillator 240a which generates a transmit signal for GSM850 and GMS900, and an oscillator 240b which generates a transmit signal for DCS1800 and PCS1900. The two oscillators are provided because the transmission oscillator is wide in frequency variable range as compared with the high frequency oscillator 250 and the intermediate frequency oscillator 230, and circuits all coverable by one oscillator cannot be designed with ease.

The analog phase comparator 237a and the digital phase comparator 237b are provided to speed up a pull-in operation at the time of start of the operation of the PLL circuit. Described specifically, the digital phase comparator 237b firstly performs a phase comparison upon the start of transmission and thereafter the digital phase comparator 237b is switched to the analog phase comparator 237a to thereby make it possible to lock a phase loop at high speed.

A control circuit 260 which controls the whole chip, an RF synthesizer 261 which constitutes a PLL circuit for RF together with the high frequency oscillator (RFVCO) 250, an IF synthesizer 262 which constitutes a PLL circuit for IF together with the intermediate frequency oscillator (IFVCO) 230, and a reference oscillator (DCXO) 264 which generates a reference oscillation signal φr used as a reference signal for these synthesizers 261 and 262, are provided over the chip for the high frequency IC 200 according to the present embodiment. An external crystal oscillator is connected to the DCXO 264. A combination of the DCXO 264 and the external crystal oscillator is equivalent to the reference oscillator 13 shown in FIG. 1. The synthesizers 261 and 262 comprise frequency dividers, phase comparators, charge pumps, loop filters, etc., respectively.

Incidentally, since the reference oscillation signal φr needs high frequency accuracy, the external crystal oscillator is connected to the reference oscillator 264. A frequency like 26 MHz or 13 MHz is selected as the reference oscillation signal φr. The crystal oscillator with such a frequency is a general purpose part and is easily available.

In FIG. 6, blocks marked with fractional numbers such as ½, ¼, etc. respectively indicate frequency dividers, and ones designated at symbols BFF indicate buffer circuits. SW1, SW2 and SW3 indicate switches each of which performs switching of a connected state in a GSM mode for performing transmission/reception in accordance with the GSM system and a DCS/PCS mode for performing transmission/reception in accordance with the DCS or PCS system, thereby to select a division ratio of a transmitted signal. SW4 indicates a switch which is on/off-controlled to supply the I and Q signals sent from the baseband circuit 300 to the modulation mixers 233a and 233b upon transmission. These switches SW1 through SW4 are controlled by signals sent from the control circuit 260.

The control circuit 260 is provided with a control register CRG. The register CRG is set based on a signal outputted from the baseband circuit 300. Described specifically, a synchronizing clock signal CLK, a data signal SDATA and a load enable signal LEN used as a control signal are supplied from the baseband circuit 300 to the high frequency IC 200. When the load enable signal LEN is asserted to an effective level, the control circuit 260 sequentially takes or fetches therein the data signal SDATA transmitted from the baseband circuit 300 in sync with the clock signal CLK and sets the same to the control register CRG. Although not restricted in particular, the data signal SDATA is serially transmitted.

The band selection circuit 20 shown in FIG. 1 is provided within the control circuit 260. The variable frequency divider 12, the fixed frequency divider 14, the phase comparator 15, the registers 21 and 24, and the arithmetic circuits 23 and 24 shown in FIG. 1 are provided within the IF synthesizer 262. Although not shown in the drawing, the decoder DEC, which decodes the band select signal outputted from the band selection circuit 20, is provided in the neighborhood of the TXVCO 240.

Although not restricted in particular, the control register CRG is provided with a bit field which designates or specifies operations modes such as a reception mode, a transmission mode, an idle mode, a warmup mode, etc., a bit field which specifies whether a signal lying in any frequency band should be transmitted or received, etc. Here, the idle mode is a mode corresponding to a sleep state in which only a small minority circuit is operated upon standby and most of circuits including at least an oscillator are deactivated. The warmup mode is a mode which starts up the PLL circuit immediately before transmission or reception. These modes are started by the commands supplied from the baseband IC 300 to the control circuit 260 of the high frequency IC 200. Each of the commands is constituted of a code (hereinafter described as "Word") having a predetermined bit length like, for example, 8 bits or 16 bits. A plurality of types of command codes are prepared in advance.

In the present embodiment, a transmission PLL circuit (TX-PLL) is configured which performs frequency conversion by means of the phase detectors 237a and 237b, the loop filter 238, the transmission oscillators (TXVCO) 240a and 240b and the offset mixer 236.

In the multiband type wireless communication system according to the present embodiment, the control circuit 260 changes the frequency φRF of the oscillation signal of the high frequency oscillator 250 according to a channel to be used upon transmission/reception, and selects or changes the switch SW2 in accordance with the GSM mode or DCS/PCS mode to change the frequency of a signal supplied to the offset mixer 236, thereby performing switching between transmit and receive frequencies. Further, the control circuit 260 supplies control signals for selecting or switching the selector switches SW1, SW2 and SW3 in accordance with the frequency bands for transmission/reception.

In the present embodiment, the oscillation frequency of the intermediate frequency oscillator (IFVCO) 230 is set to 640 MHz even in the case of any of GSM, DCS and PCS. The oscillation frequency is divided into ⅛ by the frequency divider 231 and the frequency dividing and phase shifting circuit 232, so that a carrier wave (TXIF) of 80 MHz is produced, whereby modulation is done.

The oscillation frequency of the high frequency oscillator (hereinafter described as "RFVCO") 250 is set to values different in the reception mode and the transmission mode. In the transmission mode, the oscillation frequency fRF of the RFVCO 250 is set to, for example, 3616 to 3716 MHz in the case of GSM850, 3840 to 3980 MHz in the case of GSM900, 3610 to 3730 MHz in the case of DCS and 3860 to 3980 MHz in the case of PCS. This is divided into ¼ by the corresponding frequency divider in the case of GSM and divided into ½ in the case of DCS and PCS, which in turn is supplied to the offset mixer 236 as φRF'.

The offset mixer 236 outputs a signal equivalent to the difference (fRF'−fTX) in frequency between the signal φRF' and the transmit oscillation signal φTX outputted from the transmission oscillator (TXVCO) 240. The transmission PLL (TX-PLL) is operated in such a manner that the frequency of the difference signal coincides with the frequency of the modulation signal TXIF. In other words, the TXVCO 240 is controlled so as to oscillate with the frequency equivalent to the difference between the frequency (fRF/4) of the oscillation signal φRF' outputted from the RFVCO 250 and the frequency (fTX) of the modulation signal TXIF.

In the reception mode, the oscillation frequency fRF of the RFVCO 250 is set to, for example, 3476 to 3576 MHz in the case of GSM850, 3700 to 3840 MHz in the case of GSM900, 3610 to 3730 MHz in the case of DCS and 3860 to 3980 MHz in the case of PCS. This is divided into ½ by the corresponding frequency divider in the case of GSM. It is supplied to the frequency dividing and phase shifting circuit 210 as it is in the case of DCS and PCS, where it is divided and phase-shifted, which in turn is supplied to the mixer 212.

The RFVCO 250 is constituted of an LC resonant oscillator having a configuration substantially similar to the TXVCO shown in FIG. 4. The RFVCO 250 is configured in such a manner that a plurality of capacitive elements constituting an LC resonant circuit are arranged in parallel through switch elements respectively, and the switch elements are selectively turned on by band switch signals to select the value of the connected capacitive element, i.e., C of the LC resonant circuit, thereby making it possible to select the oscillation frequency stepwise. In the RFVCO 250, the capacitance value of the variable capacitive element changes in accordance with a control voltage outputted from the loop filter lying in the RF synthesizer 261 so that the oscillation frequency changes continuously.

Incidentally, in the present embodiment, the high frequency IC 200, the high frequency filters 120a through 120d, and the crystal oscillator (not shown) connected to the reference oscillator (DCXO) in the circuit shown in FIG. 6 are mounted on one insulated board like ceramic and configured as a module. An impedance matching circuit (not shown) provided between the high frequency IC 200 and the power amplifier 130 is also mounted on the module substrate. However, the impedance matching circuit can be configured using a microstrip line formed on the module substrate. Further, the transmit-receive changeover switch 110 and the power amplifier 130, and low pass filters and an impedance matching circuit (not shown) provided between theses circuits are also mounted on the same insulated board as the high frequency IC 200, thereby making it possible to bring them into one module.

A procedure for performing mode control and raising of each VCO by the control circuit 260 in the high frequency IC having the offset PLL type transmission system circuit shown in FIG. 6 will next be explained using a timing chart shown in FIG. 7. Incidentally, FIG. 7(A) is a timing chart showing the operations of the RFVCO, IFVCO and TXVCO in a high frequency IC (hereinafter called "high frequency IC of type shown in FIG. 7(A)") which measures the frequency of each VCO and performs band selection based on its measured value. FIG. 7(B) is a timing chart showing the operations of the RFVCO, IFVCO and TXVCO in the high frequency IC according to the present embodiment.

When the system is powered on, the supply of power to the high frequency IC 200 is started. After power-on, a command corresponding to, for example, "Word4" is supplied from the baseband IC 300 to the high frequency IC 200. In doing so, the circuits such as the registers lying inside the high frequency IC 200 are respectively brought to a reset state by the control circuit 260. Thus, the high frequency IC 200 enters an idle mode (sleep state indicative of waiting for command)(see timing t1 in FIG. 7). In this state, the oscillating operation of each VCO is stopped. In the high frequency IC of type shown in FIG. 7(A), the process (measurement and storage) of measuring the frequencies of the RFVCO and IFVCO in the high frequency IC 200 is carried out when a command (Word7) comprising a predetermined bit code for instructing the measurement of each VCO is supplied from the baseband IC 300. However, nothing is done in the high frequency IC 200 according to the present embodiment (see timing t2 in FIG. 7).

Figure 7:
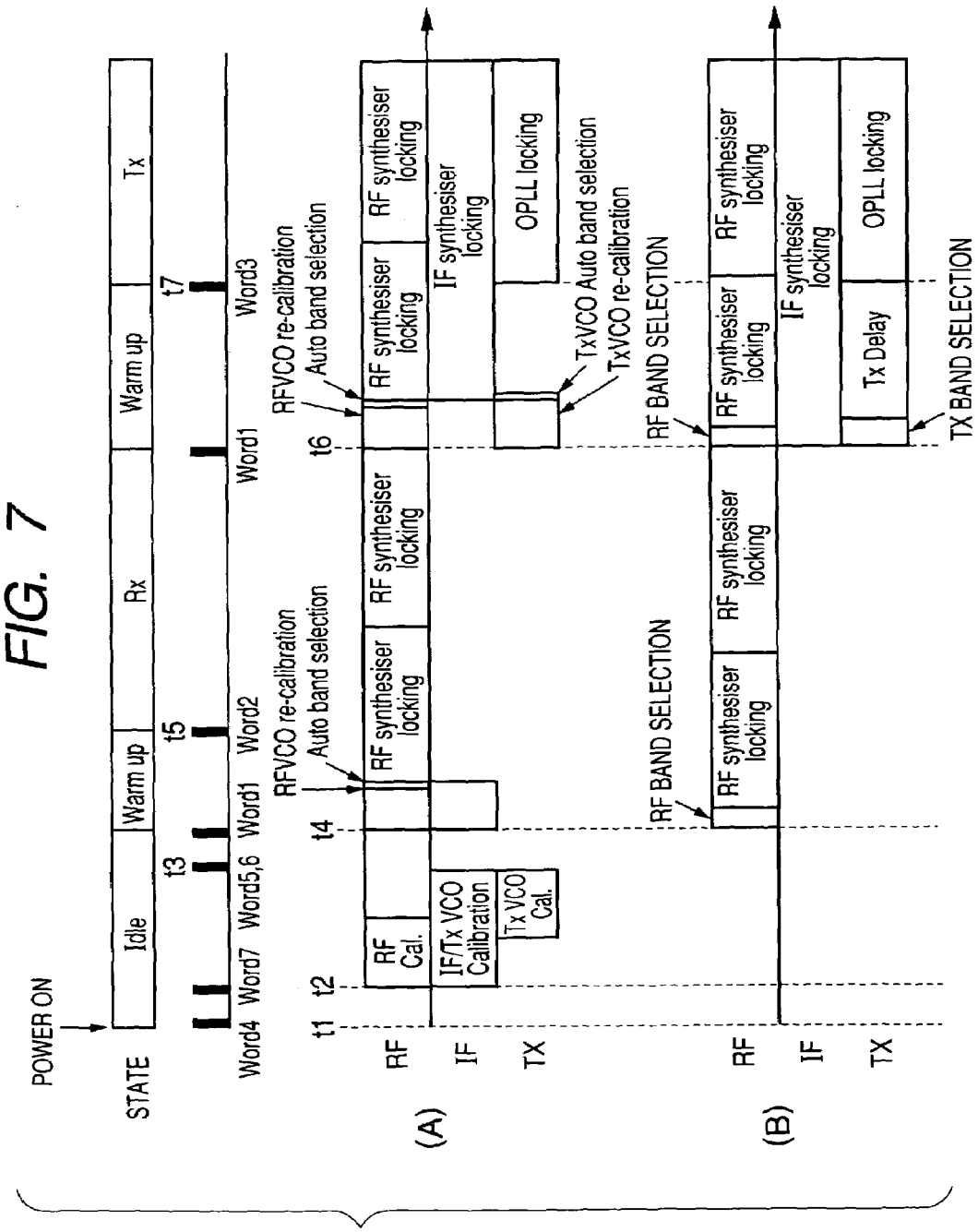
FIG. 7(A) is a timing chart showing timings provided to raise RFVCO, IFVCO and TXVCO in a high frequency IC.
FIG. 7(B) is a timing chart showing timings provided to raise RFVCO, IFVCO and TXVCO in the high frequency IC according to the present invention.

In the high frequency IC of type shown in FIG. 7(A), measurements on the frequencies in the respective bands of the RFVCO and IFVCO are carried out in parallel. Thereafter, a frequency measurement on the transmission oscillator TXVCO using a counter used in the frequency measurement on the IFVCO is performed. When it is completed, a frequency measurement on the TXVCO 240b is made. Therefore, the frequency measurement on the RFVCO is completed earlier. After the transmission of the measurement start command "Word7", the baseband IC 300 sends "Word5 and 6" for providing instructions for initial setting after elapse of a suitable period of time (see timing t3 in FIG. 7). When the frequency measurement on the TXVCO 240b is completed, its end is notified to the control circuit 260. After completion of the frequency measurement, the control circuit 260 initially sets the inside of the high frequency IC 200 for the purpose of transmission/reception.

When the initial setting is completed, a command "Word1" including values (frequency information on channels to be used) set to the registers 21A and 21B or the like is supplied from the baseband IC 300 to the high frequency IC 200. The control circuit 260 enters a warmup mode for starting the VCO (see timing t4 in FIG. 7). Bits for providing instructions for transmission or reception are also included in the command. The operation of selecting the band to be used in the RFVCO 250 is performed according to the bits on the basis of the frequency information supplied from the base band IC 300 upon reception. Then, the RFVCO 250 is caused to oscillate so as to bring an RF-PLL loop to a locked state.

Thereafter, when a command "Word2" for providing instructions for the reception is sent from the baseband IC 300, the control circuit 260 is placed in a reception mode and operates the reception system circuit RXC to amplify and demodulate a received signal (see timing t5 in FIG. 7). In the high frequency IC of type shown in FIG. 7(A), the frequency measurement on the RFVCO is performed when the command "Word1" is supplied, and thereafter the RF synthesizer is locked. Since the present frequency measurement is made to all the bands, the time required to determine the band to be used is taken long as compared with the high frequency IC according to the present embodiment, which determines the band to be used by the dichotomizing search system. When the number of bands for the RFVCO is 16, for example, the number of bands increases although the high frequency IC of type shown in FIG. 7(A) is in time even so. When the number of bands reaches 256, there is a fear that lockup of the RF synthesizer 261 is not in time for the startup of reception. On the other hand, since the band to be used is determined by the dichotomizing search system in the high frequency IC according to the present embodiment, the lockup of the RF synthesizer can be reliably terminated before the startup of reception even if the number of bands increases.

Next, a command "Word1" containing frequency information is supplied from the baseband IC 300 when the reception is completed. The control circuit 260 enters the warmup mode for starting up the VCO again (see timing t6 in FIG. 7). When the bits in the command, for providing instructions for transmission or reception indicate the transmission, the IFVCO 230 is started up to start locking of the IF synthesizer 262. Further, the operation of selecting the bands used for the RFVCO 250 and the TXVCO 240 is carried out based on the frequency information supplied from the baseband IC 300. After band determination, the RF synthesizer 261 and the TX-PLL loop are respectively brought into a locked state. Further, the control circuit 260 starts up the offset cancel circuit 213 in the present warmup mode to allow the offset cancel circuit 213 to perform input DC offset cancellations of the amplifiers in the high gain amplifier sections 220A and 220B. The time required to select the band to be used in the TXVCO 240 in the present embodiment may range from 40µ seconds to 50µ seconds.

Thereafter, a command "Word3" for providing instructions for the transmission is transmitted from the baseband IC 300 to the high frequency IC 200. When the "Word3" is received, the control circuit 260 enters a transmission mode to modify and amplify a transmit signal (see timing t7 in FIG. 7). The control circuit 260 turns on the transmit changeover or selector switch SW4 and performs even switching control on the switch SW2 and the like according to GSM or DCS/PCS. Incidentally, the reception mode and the transmission mode are respectively executed in a time unit (e.g., 577µ seconds) called "time slot".

In the high frequency IC of type shown in FIG. 7(A), the frequency measurement on the RFVCO and the frequency measurement on the TXVCO are performed when the "Word1" is supplied even when the transmission mode is reached, and thereafter the RF synthesizer and the IF synthesizer are locked. Thus, the time required to determine the band to be used is taken long (8m seconds). Since, however, the band to be used is determined by the dichotomizing search system in the high frequency IC according to the present embodiment, the lockup of the RF synthesizer can be reliably completed before the start of reception even if the number of bands increases.

Next, an embodiment illustrative of a high frequency IC in which the present invention is applied to an RF-PLL which generates a high frequency signal φRF used in common to upconversion of a transmit signal and downconversion of a received signal, and a wireless communication system using the high frequency IC will be explained using FIG. 8.

The present embodiment is applied to a so-called direct conversion type high frequency IC. The same circuits and elements as those shown in FIG. 1 are given like reference numerals through FIG. 8. Dual explanations of the same circuits and elements are omitted. Although the RF-PLL section is shown in a simplified form, it has a configuration substantially similar to the TX-PLL circuit employed in the embodiment shown in FIG. 1. The main difference between the RF-PLL shown in FIG. 8 and the TX-PLL shown in FIG. 1 resides in that the TXVCO 11 is substituted with an RFVCO 10 and the RF-PLL does not need the registers 21A and 21B and arithmetic units 22A, 22B and 23.

Figure 8:
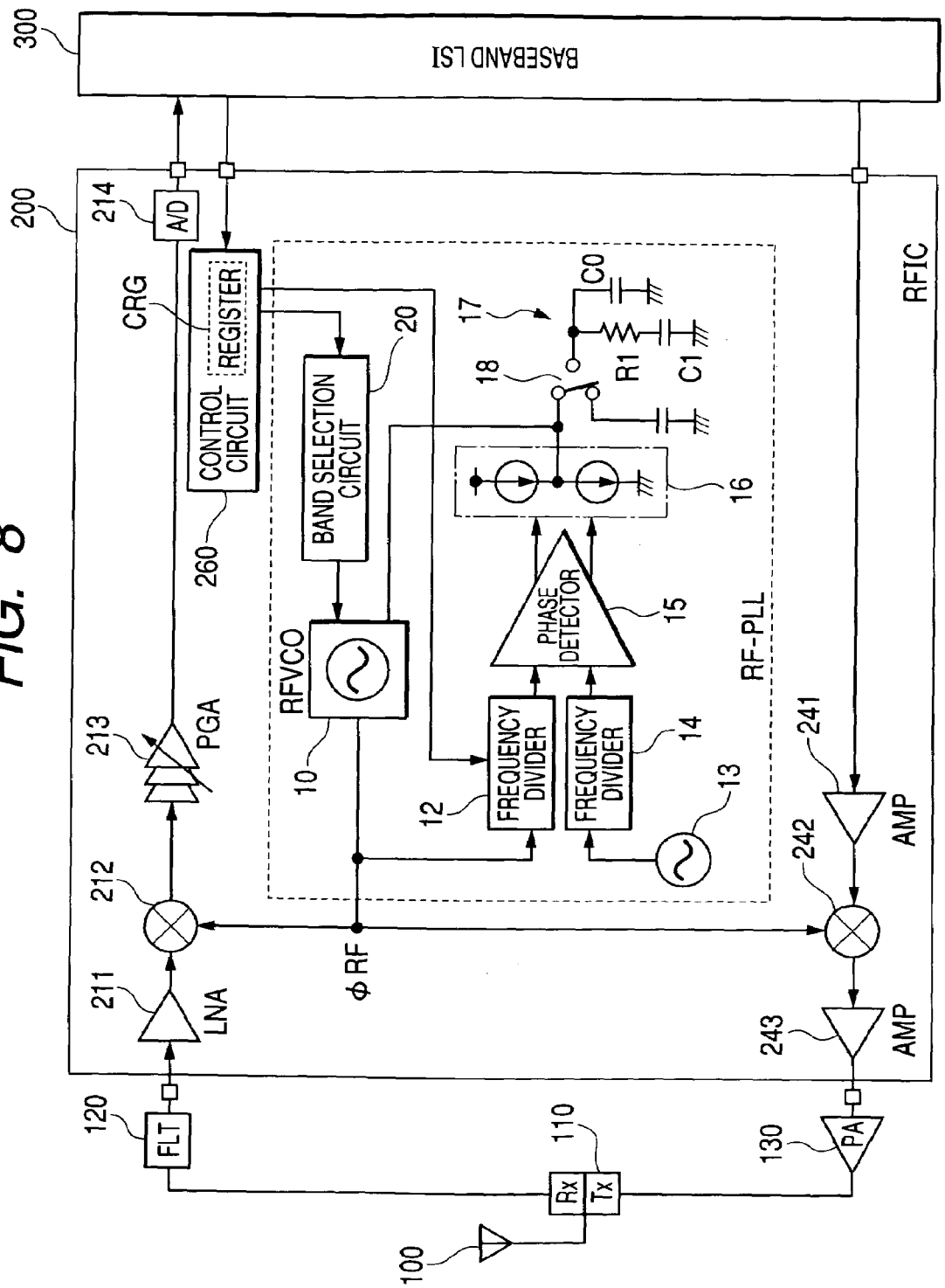
FIG. 8 is a block diagram illustrating another embodiment illustrative of a high frequency IC according to the present invention and a wireless communication system using the high frequency IC.

In the high frequency IC shown in FIG. 8, a transmission system circuit comprises an amplifier 241 which amplifies I and Q signals supplied from a baseband circuit 300, a mixer 242 which combines the amplified I and Q signals and an oscillation signal φRF generated by the RFVCO 11 to thereby effect modulation and upconversion on its result, an amplifier 243 which amplifies the modulated signal, etc.

Figure 9:
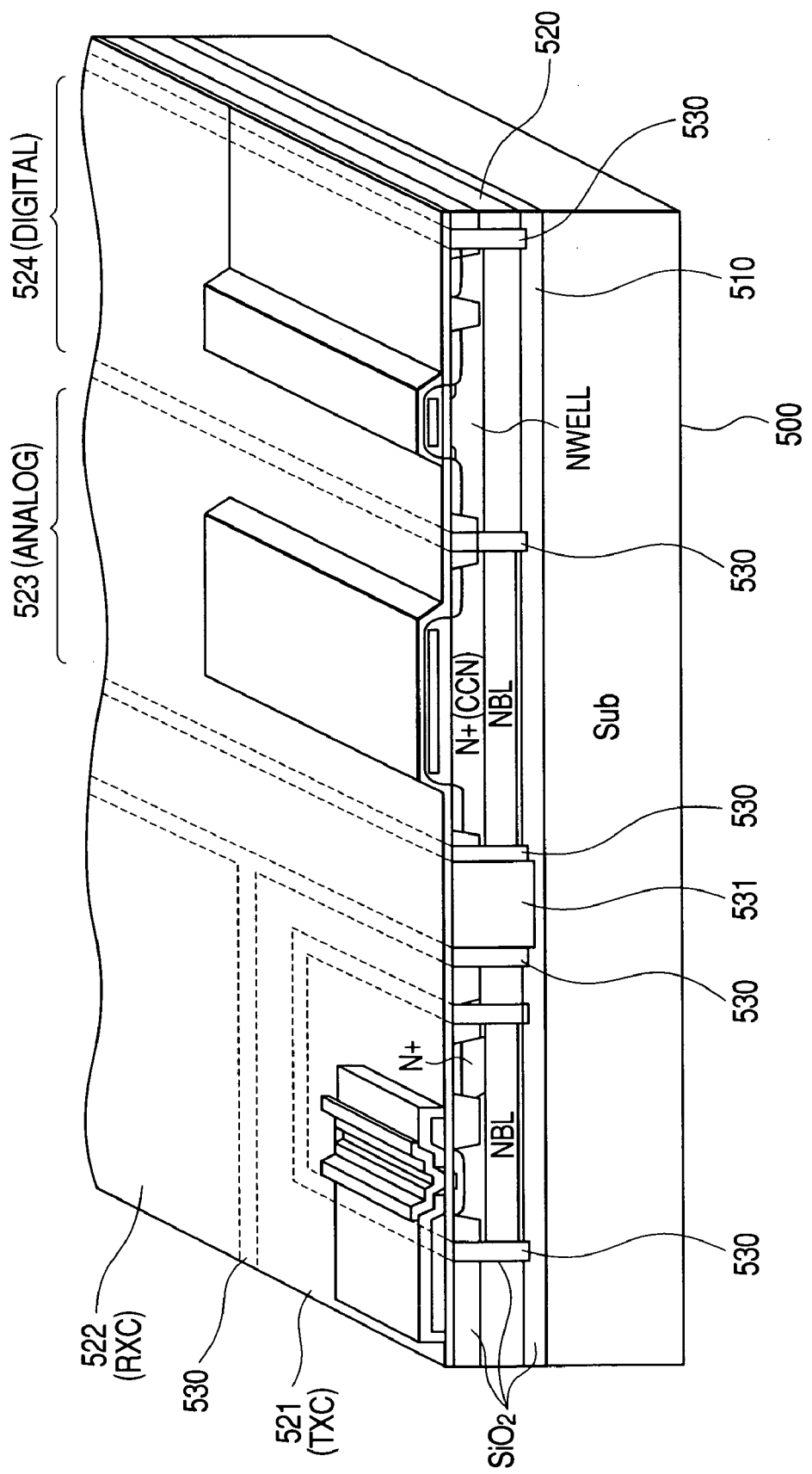
FIG. 9 is a partly sectional perspective view showing a device structure of the high frequency IC according to the embodiment shown in FIG. 8.

FIG. 9 shows a device structure of the high frequency IC according to the above embodiment. As shown in FIG. 9, the high frequency IC according to the present embodiment shows, as an example, a case where an SOI substrate in which a semiconductor layer 520 like monocrystalline silicon is formed (epitaxially grown) on a semiconductor substrate 500 like silicon through a buried oxide film 510 interposed therebetween is used as a substrate. Although the normal silicon chip may be used as the substrate, the amount of noise transmitted through the substrate can be reduced by using the SOI substrate. In the present embodiment, the semiconductor layer 520 is divided into a plurality of island regions 521 through 524 by so-called trench isolation regions 530 formed by digging such trenches as to reach the insulating layer 510 and charging them with an insulating material or insulator or the like.

Of these island regions, the first island region 521 is formed with elements that constitute a transmission system circuit TXC. The second island region 522 is formed with elements that constitute a reception system circuit RXC. The third island region 523 is formed with elements that constitute an oscillator of a control system circuit CTC and analog circuits of synthesizers 261 and 262, and the fourth island region 524 is formed with elements that constitute digital circuits (refer to symbol ISL1 in FIG. 6) such as registers, frequency dividers, phase comparators, etc. of a control circuit 260 and the synthesizers 261 and 262. The circuit shown in FIG. 1 will be explained. The TXVCO 11 is formed in the first island region 521 formed with the elements that constitute the transmission system circuit TXC. The loop filter 17 and the prescaler 121 of the variable frequency divider 12 are formed in the third island region 522. The remaining circuits are formed in the fourth island region 524.

Further, in the present embodiment, an isolation region 531 constituted of such a thick insulating layer as to reach the insulating layer 510 is formed among the island region 523 formed with the analog circuits, the island region 521 and the island region 522 respectively formed with the transmission system circuit TXC and the reception system circuit RXC. An isolation region configured of a similar insulating layer may be provided between the island region 521 formed with the transmission system circuit TXC and the island region 522 formed with the reception system circuit RXC.

Incidentally, the manner in which one respective elements are respectively formed in one respective island regions isolated by the trench isolation regions 530, is shown in FIG. 9. This is done in this way for convenience of illustration. It is not necessary to form all the elements constituting the circuits formed in their island regions in the discrete regions isolated by the trench isolation regions 530. In FIG. 9, the elements formed in the second island region 521 correspond to bipolar transistors, the elements formed in the third island region 523 correspond to capacitive elements, and the elements formed in the fourth island region 524 correspond to MOSFETs, respectively. Since the respective elements are identical in structure to the known general elements, the description of their detailed structures is omitted.

Since the transmission system circuit TXC and the reception system circuit RXC are formed in the discrete island regions as described above, it is possible to suppress transfer of noise developed in the transmission system circuit TXC to the reception system circuit RXC. Forming the analog and digital circuits in the discrete island regions makes it possible to suppress a reduction in signal accuracy and the occurrence of distortion in a signal due to the transfer of noise produced in the digital circuit to the analog circuit. Further, as to the reception system circuit RXC, the isolation regions may be formed so as to isolate regions formed with elements constituent of circuits at a spot designated at symbol ISL2 in FIG. 6. Since the elements that constitute the amplifier 211 and mixer MIX are operated at a high frequency, noise is easy to occur. Further, since the high gain amplifier section 220 has very high gain, slight noise is also amplified. Therefore, the isolation among these circuits by the isolation regions makes it hard to transfer noise developed in the amplifier 211 and mixer MIX to the high gain amplifier section 220.

Figure 10B:
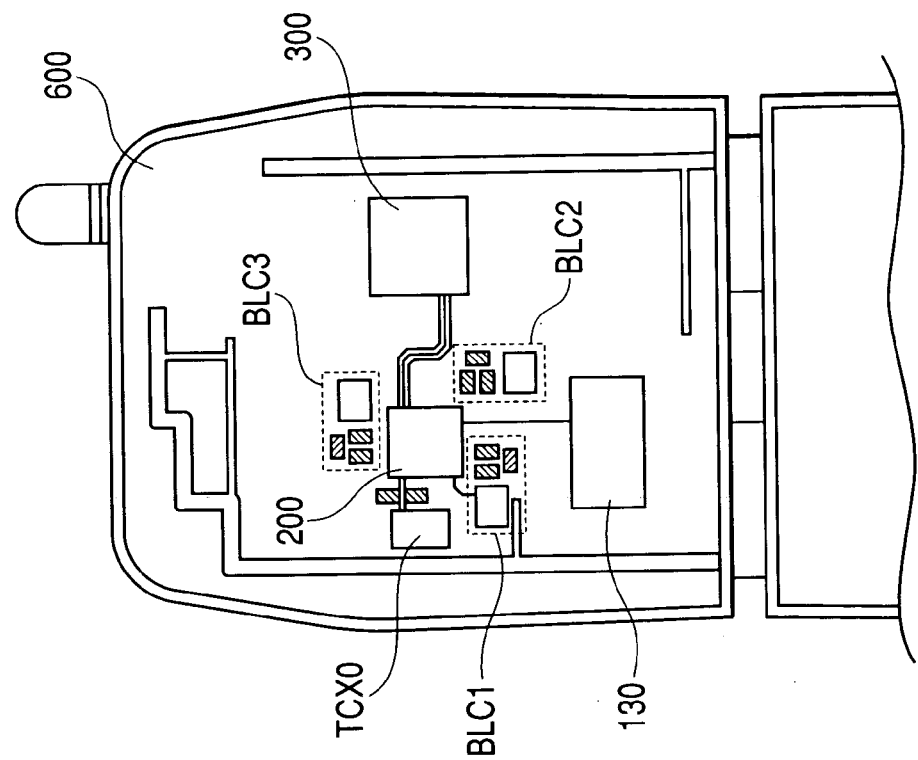
FIG. 10(B) is a system configurational diagram showing a cellular phone using a high frequency IC.
Figure 10A:
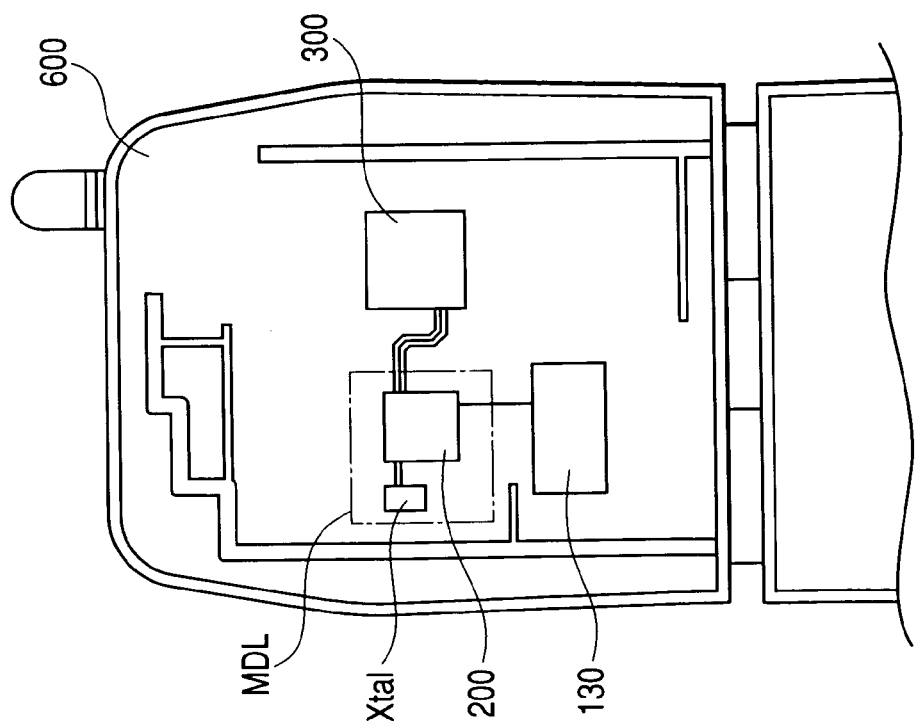
FIG. 10(A) is a system configurational diagram showing a cellular phone using a high frequency IC to which the present invention is applied.

FIGS. 10(A) and 10(B) show a system configurational example of a cellular phone illustrated as one example of a wireless communication system using the high frequency IC according to the present embodiment. FIG. 10(A) shows a cellular phone system using the high frequency IC to which the present invention is applied, and FIG. 10(B) shows a cellular phone system using a high frequency IC considered prior to the present invention.

In FIG. 10(A), reference numeral 200 indicates the high frequency IC according to the present embodiment, Xtal indicates a crystal oscillator corresponding to an external element of a reference oscillator 264, reference numeral 300 indicates a baseband IC, and reference numeral 130 indicates a power amplifier (module). These ICs and module are mounted over a printed circuit board 600. The high frequency IC 200 and the crystal oscillator Xtal are mounted to an insulated board and configured as a module MDL. In FIG. 10(B), symbols BLC1, BLC2 and BLC3 respectively indicate blocks each comprising an oscillator (module) and a filter. TCXO indicates an oscillation module including a crystal oscillator. The high frequency IC 200 and oscillator & filters BLC1, BLC2 and BLC3, and the oscillation module TCXO are further mounted to the insulated board and might be configured as a module.

As is apparent from a comparison between FIG. 10(A) and FIG. 10(B), it is understood that in the cellular phone using the high frequency IC to which the present invention is applied, the high frequency IC and its peripheral circuits are small-sized as compared with the cellular phone using the previously-considered high frequency IC, and the packaging density of the system is significantly reduced.

While the invention made by the present inventors has been described above specifically based on the embodiments, the present invention is not limited to the embodiments. Although, for example, the present embodiment is configured such that the VCO 11 is switched to any of the 256 bands, 128 bands or 512 bands or the like may be adopted. Although a description has been made of the case in which the IFVCO that generates the oscillation signal having the intermediate frequency is not configured so as to be capable of selecting any of plural bands in the wireless communication system according to the present embodiment, the present invention is not limited to it. The IF-VCO can also be configured so as to be capable of selecting any of plural bands in a manner similar to the TX-VCO and RF-VCO. The IF-VCO can be configured so as to perform a band selecting operation simultaneously with the TX-VCO and RF-VCO in the warmup mode, i.e., on a parallel with it on a time basis.

While the above description has principally been made of the case in which the invention made by the present inventors is applied to a high frequency IC employed in a wireless communication system like a cellular phone, which belongs to the field of application reaching the background of the invention, the present invention is not limited to it. The present invention can be also applied even to a high frequency IC for a wireless LAN, and a high frequency IC having a PLL circuit which combines a receive signal and a transmit signal to produce a high frequency signal for performing frequency conversion and modulation/demodulation.

What is claimed is:

1. A communication semiconductor integrated circuit device, comprising:
   a first oscillator capable of performing oscillating operations at a plurality of frequency bands and generating a oscillation signal to be combined with a received signal;
   a first frequency converter which combines the received signal and a signal related to the oscillation signal and converts the received signal to a converted signal which has a frequency lower than that of the received signal;
   a second oscillator capable of performing oscillating operations at a plurality of frequency bands and generating a transmit signal having a desired frequency;
   a high frequency signal generator which includes the first oscillator and generates the oscillation signal having a desired frequency with an signal output from a crystal oscillator as a reference signal and outputs the signal related to the oscillation signal;
   a reception system circuit including the first frequency converter; and
   a transmission system circuit including the second oscillator,
   wherein said communication semiconductor integrated circuit device is formed over one semiconductor substrate and has a first operation mode which does not perform transmission and reception, a second operation mode which performs a preparation prior to the start of transmission or reception, and a third operation mode which performs transmission or reception,
   wherein the first oscillator and the second oscillator are deactivated in the first operation mode,
   wherein the operation of selecting a used frequency band for the second oscillator or the first and second oscillators is performed in the second operation mode, and
   wherein said high frequency signal generator, said reception system circuit and said transmission system circuit are formed in different semiconductor regions isolated by insulators respectively.

2. The communication semiconductor integrated circuit device according to claim 1, wherein a common semiconductor region is provided below the semiconductor region formed with the reception system circuit and the semiconductor region formed with the transmission system circuit through a common insulator interposed therebetween.

3. The communication semiconductor integrated circuit device according to claim 1, wherein the transmission system circuit includes a signal synthesizer which receives and combines a signal obtained by detecting the transmit signal output from the second oscillator and the oscillation signal generated by the first oscillation or a signal obtained by dividing the oscillation signal to thereby generate an output signal having a frequency corresponding to a difference in frequency between the received signals, a phase difference detector which compares the phase of the output signal of the signal synthesizer with the phase of a post-modulated signal to thereby detect a phase difference, and a loop filter which generates a voltage corresponding to the phase difference detected by the phase difference detector, and a control loop is provided which controls the oscillation frequency of the second oscillator by the voltage generated by the loop filter.

4. The communication semiconductor integrated circuit device according to claim 3, further comprising:
   switching means capable of supplying a potential of a predetermined level to the second oscillator as a control voltage in a state in which the control loop is opened;
   a variable frequency divider which divides the output signal of the second oscillator at a designated division ratio;
   a fixed frequency divider which divides the oscillation signal generated by the crystal oscillator at a predetermined division ratio;
   a phase comparator which compares the phase of a signal outputted from the variable frequency divider with the phase of a signal outputted from the fixed frequency divider to thereby detect a lead or lag in phase; and
   a band selection circuit which determines a frequency band in the second oscillator according to the output of the phase comparator,
   wherein the band selection circuit repeatedly executes the comparison between the phase of the output signal of the variable frequency divider and the phase of the output signal of the fixed frequency divider and a change in the selected frequency based on the result of comparison, in a state in which the potential of the predetermined level has been supplied to the second oscillator by the switching means, thereby to select a desired frequency band by a dichotomizing search system.

5. The communication semiconductor integrated circuit device according to claim 1, further comprising:
   a third oscillator which generates an oscillation signal lower in frequency than the oscillation signal generated by the first oscillator,
   wherein the first oscillator and the third oscillator respectively perform oscillating operations on the basis of information about oscillation frequencies supplied from outside, and the second oscillator performs an oscillating operation on the basis of information obtained from information about the oscillation frequency of the first oscillator and information about the oscillation frequency of the third oscillator.

6. The communication semiconductor integrated circuit device according to claim 5, wherein the first oscillator and the second oscillator respectively perform the operation of selecting frequency bands, in parallel on a time basis.

7. The communication semiconductor integrated circuit device according to claim 5, wherein the third oscillator is configured so as to be capable of performing oscillating operations at a plurality of frequency bands and performs the operation of selecting a used frequency band in parallel with the first oscillator and the second oscillator on a time basis.

8. The communication semiconductor integrated circuit device according to 7, wherein the operation of selecting the frequency band to be used in the first oscillator and the second oscillator is performed in the second operation mode.

9. The communication semiconductor integrated circuit device according to claim 1, wherein the band selection circuit has an offset applying circuit which adds a predetermined value to a signal indicative of the oscillation frequency band of the second oscillator, which is selected by comparing the phase of the output signal of the variable frequency divider with the phase of the output signal of the fixed frequency divider and thereby generates a signal for designating a desired frequency band.

10. A communication semiconductor integrated circuit device, comprising:
   an oscillator capable of performing oscillating operations at a plurality of frequency bands and generating an oscillation signal to be combined with a received signal;
   a first frequency converter which combines the received signal and the oscillation signal generated by the oscillator and converts the received signal to a converted signal which has a frequency lower than that of the received signal;
   a second frequency converter which combines a post-modulation transmit signal and the oscillation signal generated by the oscillator and converts the post-modulation transmit signal to a transmission signal which has a frequency higher than that of the post-modulation transmit signal;
   a high frequency signal generator which includes the oscillator and controls the oscillation a signal having a desired frequency referring to a signal outputted from a crystal oscillator as a reference signal;
   a reception system circuit including the first frequency converter; and
   a transmission system circuit including the second frequency converter,
   wherein said communication semiconductor integrated circuit device is formed over one semiconductor substrate and has a first operation mode which does not perform transmission and reception, a second operation mode which performs a preparation prior to the start of transmission or reception, and a third operation mode which performs transmission or reception,
   wherein the oscillator is deactivated in the first operation mode,
   wherein the operation of selecting a desired frequency band for the oscillator is performed in the second operation mode, and
   wherein said high frequency signal generator, said reception system circuit and said transmission system circuit are formed in different semiconductor regions isolated by insulators respectively.

11. The communication semiconductor integrated circuit device according to claim 1, wherein the first frequency converter is configured so as to have a quadrature demodulating function, and an analog to digital (A/D) converter is provided therein which converts analog I and Q signals demodulated by the first frequency converter to digital signals and outputs the same therefrom.

12. A wireless communication system comprising:
   a communication semiconductor integrated circuit device according to claim 5; and
   a baseband circuit which performs baseband processing of transmit-receive data,
   wherein information about the oscillation frequency is supplied from the baseband circuit to the communication semiconductor integrated circuit device.

13. The communication semiconductor integrated circuit device according to claim 10, wherein the first frequency converter is configured so as to have a quadrature demodulating function, and an analog-to-digital (A/D) converter is provided therein which converts analog I and Q signals demodulated by the first frequency converter to digital signals and outputs the same therefrom.

14. A wireless communication system comprising:
   a communication semiconductor integrated circuit device according to claim 10; and
   a baseband circuit which performs baseband processing of transmit-receive data, wherein information about the oscillation frequency is supplied from the baseband circuit to the communication semiconductor integrated circuit device.

* * * * *